(12) United States Patent
Hattori

(10) Patent No.: US 11,266,049 B2
(45) Date of Patent: Mar. 1, 2022

(54) COMPONENT MOUNTING MACHINE

(71) Applicant: FUJI CORPORATION, Chiryu (JP)

(72) Inventor: Kazuma Hattori, Aisai (JP)

(73) Assignee: FUJI CORPORATION, Chiryu (JP)

( * ) Notice: Subject to any disclaimer, the term of this patent is extended or adjusted under 35 U.S.C. 154(b) by 404 days.

(21) Appl. No.: 15/755,894

(22) PCT Filed: Sep. 3, 2015

(86) PCT No.: PCT/JP2015/075122
§ 371 (c)(1),
(2) Date: Feb. 27, 2018

(87) PCT Pub. No.: WO2017/037926
PCT Pub. Date: Mar. 9, 2017

(65) Prior Publication Data
US 2019/0037742 A1    Jan. 31, 2019

(51) Int. Cl.
H05K 13/08    (2006.01)
H05K 13/04    (2006.01)
(Continued)

(52) U.S. Cl.
CPC ..... H05K 13/0812 (2018.08); H05K 13/0061 (2013.01); H05K 13/021 (2013.01);
(Continued)

(58) Field of Classification Search
CPC ............ H05K 13/0061; H05K 13/021; H05K 13/0409; H05K 13/0419; H05K 13/0812;
(Continued)

(56) References Cited

U.S. PATENT DOCUMENTS

2002/0006219 A1* 1/2002 Hudson .............. H05K 13/0812
382/153
2007/0208449 A1* 9/2007 Konrath ............. H05K 13/0812
700/121
(Continued)

FOREIGN PATENT DOCUMENTS

JP    2005-56191 A    3/2005
JP    2006-13120 A    1/2006
(Continued)

OTHER PUBLICATIONS

Extended European Search Report dated Mar. 18, 2019 in Patent Application No. 15903045.1, 9 pages.
(Continued)

Primary Examiner — A. Dexter Tugbang
(74) Attorney, Agent, or Firm — Oblon, McClelland, Maier & Neustadt, L.L.P.

(57) ABSTRACT

There is provided technology which is a component mounting machine which mounts electronic components onto a circuit substrate and is capable of displaying a movable region of an inner portion of the component mounting machine within a same image. The component mounting machine is provided with a fixed camera which monitors the inner portion of the component mounting machine and a display section which is capable of displaying a captured image of the fixed camera. The fixed camera is capable of imaging a range from a pickup position at which the suction nozzle picks up the electronic component which is supplied from the component feeder to a mounting position at which the electronic component is mounted onto the circuit substrate within the same image.

6 Claims, 3 Drawing Sheets

(51) Int. Cl.
  *H05K 13/02* (2006.01)
  *H05K 13/00* (2006.01)
  *H05K 3/30* (2006.01)

(52) U.S. Cl.
  CPC ..... *H05K 13/0409* (2018.08); *H05K 13/0419* (2018.08); *H05K 13/0813* (2018.08); *H05K 3/303* (2013.01); *H05K 13/083* (2018.08); *H05K 13/087* (2018.08); *H05K 2203/163* (2013.01); *Y10T 29/53174* (2015.01); *Y10T 29/53191* (2015.01)

(58) Field of Classification Search
  CPC ............... H05K 13/0813; H05K 3/303; H05K 2203/163; H05K 13/083; H05K 13/087; Y10T 29/53174; Y10T 29/53191
  See application file for complete search history.

(56) References Cited

U.S. PATENT DOCUMENTS

2012/0320188 A1* 12/2012 Yamasaki .......... H05K 13/0812
  348/87
2014/0150254 A1* 6/2014 Kasuga ................ H05K 13/021
  29/832
2014/0207270 A1* 7/2014 Otsuka ................ H05K 13/087
  700/121

FOREIGN PATENT DOCUMENTS

| | | | |
|---|---|---|---|
| JP | 2008010594 A | * | 1/2008 |
| JP | 2010-171633 A | | 8/2010 |
| JP | 2013-98452 A | | 5/2013 |
| JP | 2013-105820 A | | 5/2013 |
| JP | 2014-191787 A | | 10/2014 |
| WO | WO 2014/068766 A1 | | 5/2014 |
| WO | 2014/136211 A1 | | 9/2014 |

OTHER PUBLICATIONS

International Search Report dated Dec. 1, 2015 in PCT/JP2015/075122 filed Sep. 3, 2015.

* cited by examiner

COMPONENT MOUNTING MACHINE

CROSS-REFERENCE TO RELATED APPLICATION

This application is a United States national stage application of International Application No. PCT/JP2015/075122, filed Sep. 3, 2015, which designates the United States, and the entire contents of this international application are hereby incorporated herein by reference in entirety.

TECHNICAL FIELD

The present description relates to a component mounting machine which mounts electronic components onto a circuit board.

BACKGROUND ART

PTL 1 discloses a component mounting machine which mounts electronic components onto a circuit substrate. The component mounting machine is provided with a tape feeder, a guide cover which covers the top of a tape guide path, a camera capable of imaging an inspection area from above the guide cover, an image recognition section which processes an image of the inspection area to perform image recognition, and an inspection means for performing determination based on the inspection. The tape guide path guides empty tape which is discharged from the tape feeder downwards. In this component mounting machine, when the tape feeder is set on a feeder setting base, if the empty tape which is discharged from the tape feeder is set in a state of overhanging the upper face of the guide cover or the empty tape assumes a state of overhanging the upper face side of the guide cover due to a tape feeding operation after the setting of the tape feeder, the image recognition section is not able to recognize the upper face of the guide cover from the image which is captured by the camera. The inspection means detects the empty tape overhanging the upper face side of the guide cover according to whether the image recognition section is able to recognize the upper face of the guide cover.

CITATION LIST

Patent Literature

PTL 1: JP-A-2013-98452

SUMMARY OF INVENTION

Technical Problem

In the component mounting machine which is disclosed in PTL 1, it is possible to detect an error in which the empty tape which is discharged from the tape feeder overhangs the upper face side of the guide cover from the image which is captured by the camera. However, in the component mounting machine of PTL 1, since the imaging range of the camera is local, it is not possible to determine the state of the other portions of the inner portion of the component mounting machine, and there is a case in which an error of the component mounting machine occurs from a combination of multiple phenomena so that even if it is possible to determine that the error occurs from the image of the local camera, it is not possible to specify the origin of the error. Therefore, it may be difficult to appropriately handle the detected error. The present description discloses a component mounting machine which is capable of appropriately handling an error which arises in the inner portion of the component mounting machine by enabling wide-range capturing of the inner portion of the component mounting machine.

The component mounting machine disclosed in the present description mounts electronic components onto a circuit substrate. A component mounting machine includes a conveyance lane which conveys a circuit substrate, a component feeder which is disposed at a position distanced from the conveyance lane and which houses an electronic component, a suction nozzle which picks up the electronic component by suctioning an upper face of the electronic component, a transfer head which supports the suction nozzle and moves the suction nozzle relative to the component feeder and the circuit substrate conveyed in the conveyance lane such that the suction nozzle picks up the electronic component supplied from the component feeder and mounts the electronic component picked up by the suction nozzle onto the circuit substrate conveyed by the conveyance lane, a fixed camera which monitors an inner portion of the component mounting machine, a display section which is capable of displaying a captured image of the fixed camera, and a control device which controls operations of the transfer head. The fixed camera is capable of imaging a range from a pickup position at which the suction nozzle picks up the electronic component which is supplied from the component feeder to a mounting position at which the electronic component is mounted onto the circuit substrate within a single image.

In the component mounting machine, it is possible to image a range from a pickup position at which the suction nozzle picks up the electronic component which is supplied from the component feeder to a mounting position at which the electronic component is mounted onto the circuit substrate within the same image using the fixed camera. Therefore, it is possible to image the movable region of the suction nozzle of the inner portion of the component mounting machine using the single fixed camera. Detailed investigations performed the present inventor have established that, in comparison with a case in which an error location is locally monitored, it is possible to easily determine the cause of the error of the component mounting machine by ascertaining the state of the movable region of the inner portion of the component mounting machine. Therefore, it is possible to appropriately handle an error of the inner portion of the component mounting machine in comparison to a component mounting machine of the related art.

DESCRIPTION OF EMBODIMENTS

Figure 1:
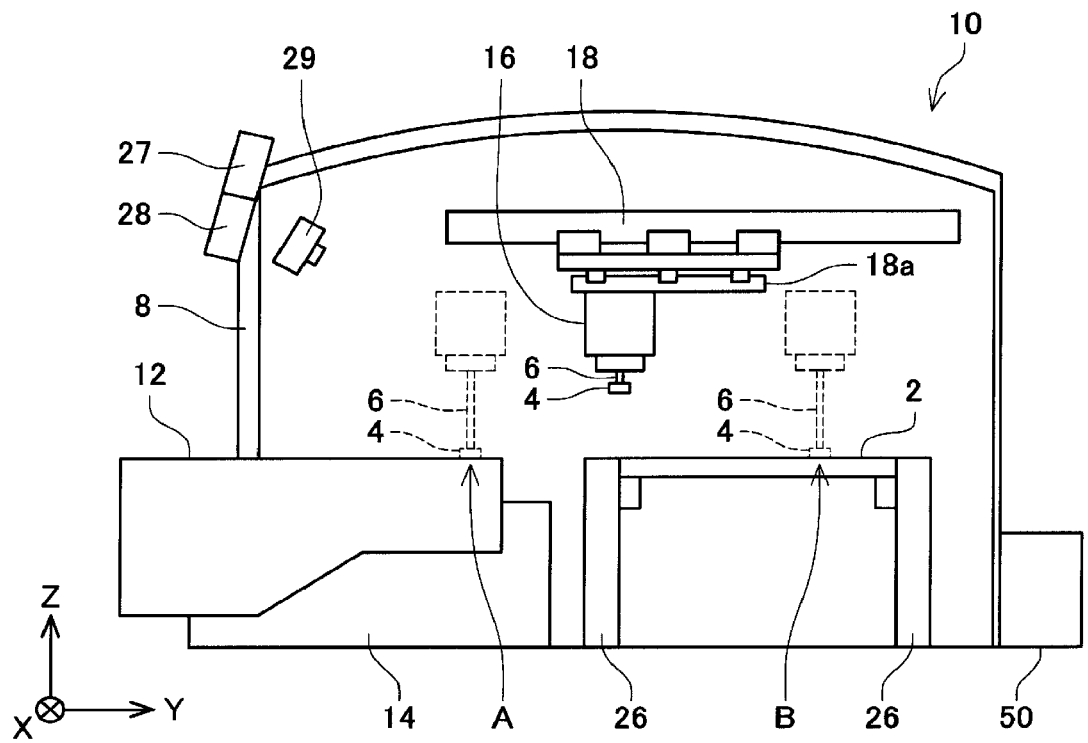
FIG. 1 is a side view schematically illustrating the configuration of a component mounting machine of a first embodiment.

The main characteristics of the embodiments described hereinafter will be listed. The technical elements described hereinafter are each independent technical elements, exhibit technical usefulness on their own or in various combinations, and are not limited to the combinations described in the claims at the time of application.

(Characteristic 1)

In the component mounting machine disclosed in the present description, a fixed camera may be disposed in the inner portion of the component mounting machine on a side more distanced from the mounting position than the pickup position in a first direction joining the pickup position and the mounting position. By disposing the fixed camera on the pickup position side, it is possible to reduce the hindrance of the movement of a suction nozzle by the fixed camera.

(Characteristic 2)

In the component mounting machine disclosed in the present description, a control device may be provided with a determination section which determines whether the component mounting machine is operating correctly and a memory section which stores a captured image of the fixed camera. The fixed camera captures an image every predetermined period and the memory section may continue storing a captured image which is captured every predetermined period by the fixed camera while the determination section determines that the component mounting machine is operating correctly, whereas, in a case in which the determination section determines that an abnormality occurs in the component mounting machine, the memory section may stop storing the captured images which are captured by the fixed camera thereafter. According to this configuration, it is possible to hold, in the memory section, a captured image which is stored when an abnormality occurs in the component mounting machine.

(Characteristic 3)

In the component mounting machine disclosed in the present description, the component feeder may be further provided with a detection section which detects that the component feeder is inserted into the component mounting machine. The control device may cause the display section to display the captured image in a case in which the detection section detects that the component feeder is inserted into the component mounting machine. According to this configuration, a user can ascertain the state of the inner portion of the component mounting machine during the insertion of the component feeder.

(Characteristic 4)

The component mounting machine disclosed in the present description may be further provided with an operation section which is electrically connected to the control device. The control device may cause the display section to display the captured image which is captured by the fixed camera based on an operation of the operation section by the user. According to this configuration, a user can check the state of the inner portion of the component mounting machine at any time.

(Characteristic 5)

In the component mounting machine disclosed in the present description, the component feeder may be further provided with an external camera which is attached to the component mounting machine that is on the outside of the component mounting machine and captures a user working area every predetermined period. The memory section may continue storing an image which is captured every predetermined period by the external camera while the determination section determines that the component mounting machine is operating correctly, whereas, in a case in which the determination section determines that an abnormality occurs in the component mounting machine, the memory section may stop storing the images which are captured by the external camera thereafter. According to this configuration, it is possible to hold, in the memory section, a working image of the user which is stored when an abnormality occurs in the component mounting machine.

First Embodiment

Hereinafter, a description will be given of a first embodiment, component mounting machine 10. Component mounting machine 10 is an apparatus which mounts electronic components 4 onto a circuit substrate 2. Component mounting machine 10 is also referred to as a surface mounting machine or a chip mounter. Ordinarily, component mounting machine 10 is installed together in series with a solder printing machine, other component mounting machines, and a board inspection machine to configure a mounting line. Examples of circuit substrate 2 include a printed wiring board on which electronic circuit components are yet to be mounted, a printed circuit board on which electronic circuit components are mounted onto one surface and electrically connected and on which electronic circuit components are yet to be mounted onto the other surface, a substrate on which bare chips are installed and which configures a chip-attached board, a substrate on which electronic circuit components provided with ball grid arrays are installed, and a substrate having a three-dimensional shape.

As illustrated in FIG. 1, component mounting machine 10 is provided with multiple component feeders 12, feeder holding section 14, transfer head 16, moving device 18 which moves transfer head 16, conveyance lane 26, operation section 27, display section 28, fixed camera 29, and control device 50.

Each of the component feeders 12 houses multiple electronic components 4. Component feeders 12 are removably attached to feeder holding section 14 and supply electronic components 4 to transfer head 16. Feeder holding section 14 is provided on the front face side of component mounting machine 10. Therefore, the user is able to mount or remove component feeders 12 to or from feeder holding section 14 from the front face side of component mounting machine 10. The specific configuration of component feeders 12 is not particularly limited. For example, each of the component feeders 12 may be any of a tape feeder which houses multiple electronic components 4 in wound tape form, a tray feeder which houses multiple electronic components 4 on a tray, or a bulk feeder which houses multiple electronic components 4 inside a container in a loose state.

Moving device 18 moves transfer head 16 between component feeders 12 and circuit substrate 2. Moving device 18 of the present embodiment is an XY-robot which moves movement base 18a in the X-direction and the Y-direction. Moving device 18 is configured by a guide rail which guides movement base 18a, a moving mechanism which moves movement base 18a along the guide rail, a motor which drives the moving mechanism, and the like. Moving device 18 is disposed above component feeders 12 and circuit substrate 2. Transfer head 16 is attached to movement base 18a. Transfer head 16 moves between above component feeders 12 and above circuit substrate 2 due to moving device 18.

Transfer head 16 is provided with suction nozzle 6 which picks up an electronic component 4. Suction nozzle 6 can be attached and detached to and from transfer head 16. Suction nozzle 6 is attached to transfer head 16 to be capable of moving in the up-down direction (the Z-direction in the drawings). Suction nozzle 6 is lifted and lowered in the up-down direction by an actuator (not illustrated) which is housed by transfer head 16 and is configured to be capable of picking up an electronic component 4. In order to mount an electronic component 4 onto circuit substrate 2 using transfer head 16, first, suction nozzle 6 is moved downward until the lower face (the suction surface) of suction nozzle 6 comes into contact with the electronic component 4 at a pickup position at which suction nozzle 6 picks up the electronic component 4 which is housed in component feeder 12. Next, suction nozzle 6 picks up the electronic component 4 and is caused to move upward. Then, transfer head 16 is positioned at the mounting position, at which the electronic component 4 is mounted onto circuit substrate 2, by moving device 18. Next, the electronic component 4 is mounted onto circuit substrate 2 by lowering suction nozzle 6 toward circuit substrate 2. The multiple component feeders 12 are attached to feeder holding section 14 and each component feeder 12 is provided with a corresponding pickup position. Therefore, there are multiple pickup positions of component mounting machine 10. Since the electronic components 4 are to be mounted at multiple different positions on the circuit substrate 2, there are also multiple mounting positions of component mounting machine 10. Specifically, for example, as illustrated in FIG. 1, the pickup position and the mounting position of the component mounting machine 10 are a position A and a position B, respectively. Suction nozzle 6, electronic component 4, and transfer head 16 are illustrated at the pickup position A and the mounting position B using dashed lines.

Conveyance lane 26 performs loading of circuit substrate 2 to component mounting machine 10, the positioning of circuit substrate 2 in component mounting machine 10, and unloading of circuit substrate 2 from component mounting machine 10. For example, it is possible to configure conveyance lane 26 of the present embodiment using a pair of belt conveyors, a supporting device (not illustrated) which is attached to the belt conveyor and supports circuit substrate 2 from below, and a driving device which drives the belt conveyor. Operation section 27 is an input device which receives instructions of the user. Display section 28 is a display device which displays various information to the user. Operation section 27 and display section 28 are attached to the top of the front face of housing 8. Therefore, operation section 27 and display section 28 are disposed at the front face side of the component mounting machine, that is, the side on which the attaching and detaching operations of component feeders 12 with respect to feeder holding section 14 are performed. As is clear from FIG. 1, housing 8 covers a portion of the upper faces of component feeders 12, transfer head 16, moving device 18, and conveyance lane 26. Accordingly, the cavity inside housing 8 becomes a closed cavity which is separated from the outside space and the entrance of dust from the outside is prevented. Since the cavity inside component mounting machine 10 is covered by housing 8, the user is not able to directly view the state of the inside of component mounting machine 10.

Fixed camera 29 monitors the inner portion of component mounting machine 10. As illustrated in FIG. 1, fixed camera 29 is disposed in the inner portion of component mounting machine 10 on the side which is more distanced from the mounting position than the pickup position in the first direction (the Y-direction in the drawing) which joins the pickup position at which suction nozzle 6 picks up electronic component 4 and the mounting position at which electronic component 4 is mounted onto circuit substrate 2. In other words, fixed camera 29 is disposed such that the pickup position is positioned between the mounting position and fixed camera 29. Specifically, the fixed camera 29 is attached above component feeders 12 on the front face side of housing 8 (the front face side of component mounting machine 10) and is capable of imaging a range from the pickup position to the mounting position within the same image. As described above, since component mounting machine 10 includes multiple pickup positions and multiple mounting positions, fixed camera 29 is capable of imaging the multiple pickup positions and the multiple mounting positions within the same image. In other words, fixed camera 29 is capable of imaging the movable region of suction nozzle 6 in the inner portion of component mounting machine 10 within the same image. The imaging by fixed camera 29 is performed every predetermined period (every extremely short period of time). The captured image of fixed camera 29 can be displayed on display section 28.

Control device 50 is configured using a computer which is provided with a CPU, ROM, and RAM. Component feeders 12, transfer head 16, moving device 18, operation section 27, display section 28, and fixed camera 29 are connected to control device 50 to be capable of communication. By controlling these items, control device 50 performs the mounting of electronic components 4 onto circuit substrate 2 and the display of the captured image of fixed camera 29 on display section 28.

Figure 2:
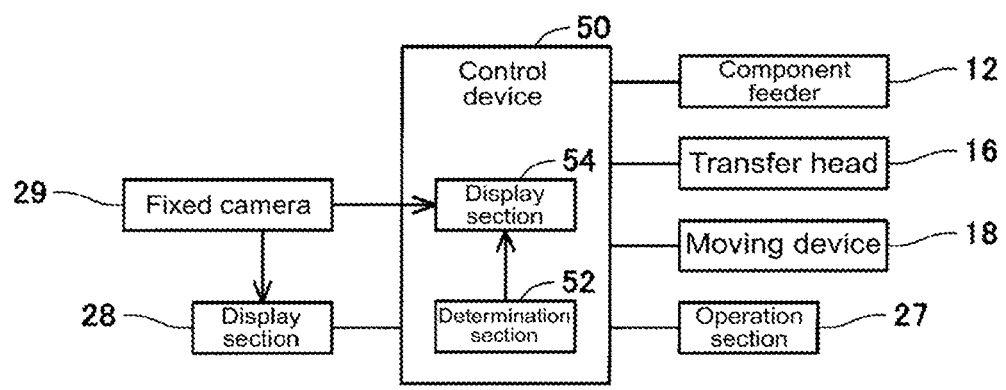
FIG. 2 is a block diagram illustrating the configuration of a control system of the component mounting machine of the first embodiment.

As illustrated in FIG. 2, control device 50 is provided with determination section 52 and memory section 54. Determination section 52 determines whether component mounting machine 10 is operating correctly. In other words, sensors and cameras which are not illustrated are disposed on the parts of component mounting machine 10 and the signals from the sensors and cameras are input to control device 50. Determination section 52 of control device 50 determines whether component mounting machine 10 is operating correctly based on the signals from the sensors and cameras. For example, when human error such as mistaken setting when inserting a component feeder 12 into component mounting machine 10, faults of suction nozzle 6 inside component mounting machine 10, or malfunctions such as conveyance errors of the circuit substrate 2 occur, determination section 52 determines that component mounting machine 10 is not operating correctly (an abnormality has occurred).

Figure 3:
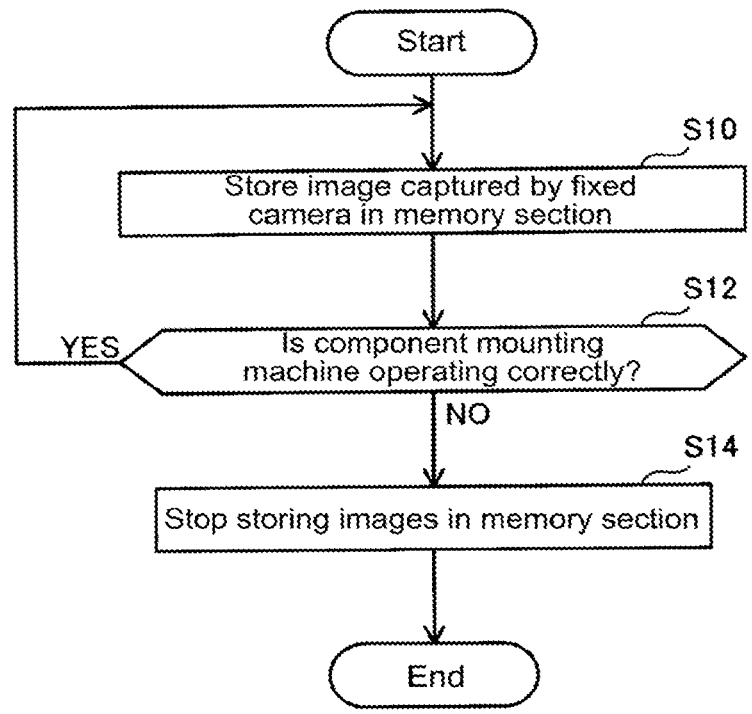
FIG. 3 is a diagram illustrating a flowchart of a process of storing a captured image of a fixed camera in a memory section in the component mounting machine of the first embodiment.

Memory section 54 stores the captured image of fixed camera 29. Here, a description will be given of the storage process of memory section 54 using FIG. 3. First, memory section 54 stores, in order, the captured images of fixed camera 29 which are captured every predetermined period (S10). Although the captured images of fixed camera 29 are accumulated in memory section 54, memory section 54 continues the storage of the captured images by overwriting in order from the old captured images with the new captured images. Therefore, memory section 54 does not require a large memory capacity. Next, while determination section 52 determines that the component mounting machine 10 is operating correctly (YES in S12), memory section 54 continues to store the captured images of fixed camera 29 (return to S10). However, in a case in which determination section 52 determines that an abnormality has occurred in component mounting machine 10 (NO in S12), memory section 54 stops storing the captured images of fixed camera 29 thereafter (S14). Accordingly, it is possible to prevent the captured images of the time at which the abnormality occurred in component mounting machine 10 from being overwritten by the captured images after the abnormality occurred in component mounting machine 10. It is possible to display (to reproduce) the captured images which are stored by memory section 54 on display section 28 by operating operation section 27. It is possible to transmit the captured images which are stored by memory section 54 to an external device by connecting component mounting machine 10 to the external device. Control device 50 may include a function of stopping the operation of component mounting machine 10 in a case in which it is determined that an abnormality has occurred in component mounting machine 10.

A description will be given of the operations and effects of component mounting machine 10 of the first embodiment. In component mounting machine 10 is it possible to capture an image of the movable region (a range from the pickup position to the mounting position) of the inner portion of component mounting machine 10 within the same image using fixed camera 29. It is possible to display the captured image on display section 28. Therefore, the user is able to ascertain at once the state of the inner portion of component mounting machine 10.

It is possible to store (save) the captured images when an abnormality occurs in component mounting machine 10 using control device 50 (determination section 52 and memory section 54). Therefore, the user is able to instantaneously ascertain the occurrence origin of the abnormality by reproducing the captured images. Therefore, it is possible to reduce the workload and time required for investigation of the cause of the abnormality.

Second Embodiment

Hereinafter, a description will be given of a second embodiment, component mounting machine 10a, with reference to FIG. 4. Hereinafter, the description will be given only on the points which differ from the first embodiment and detailed descriptions of configurations which are the same as the first embodiment will be omitted. The same applies to the other embodiments.

Figure 4:
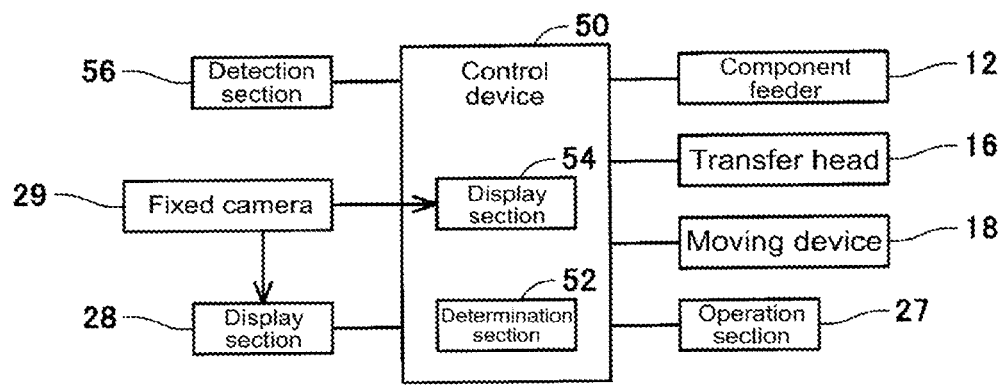
FIG. 4 is a block diagram illustrating the configuration of a control system of a component mounting machine of a second embodiment.

As illustrated in FIG. 4, component mounting machine 10a is provided with detection section 56. Detection section 56 detects whether component feeder 12 is attached to component mounting machine 10a (feeder holding section 14). Detection section 56 is connected to control device 50 to be capable of communicating and the detection results of detection section 56 are input to control device 50. For detection section 56, for example, it is possible to use a mechanism which detects that fixed camera 29 recognizes component feeder 12 or a mechanism which detects component feeder 12 using a sensor.

Control device 50 causes display section 28 to display the captured image of fixed camera 29 in a case in which detection section 56 detects component feeder 12. Therefore, the user is able to easily ascertain the state of the inner portion of component mounting machine 10a during the mounting of component feeder 12. Therefore, the user is able to perform the work of mounting component feeder 12 while checking the captured image which is displayed on display section 28 and is able to prevent component feeder 12 from being set at an incorrect position. In component mounting machine 10a of the second embodiment too, since the configuration of fixed camera 29 is the same as that of the first embodiment, it is possible to obtain the same operations and effects as component mounting machine 10 of the first embodiment.

Third Embodiment

Next, a description will be given of a component mounting machine of a third embodiment. In the component mounting machine of this embodiment, control device 50 causes the display section 28 to display the captured image which is captured by fixed camera 29 based on an operation of operation section 27 by the user. In other words, the user is able to check the image of the inner portion of the component mounting machine at any time. Therefore, the user is able to personally ascertain the state of the inner portion of the component mounting machine regularly regardless of whether the component mounting machine is operating correctly. In the present embodiment too, since the configuration of fixed camera 29 is the same as that of the first embodiment, it is possible to obtain the same operations and effects as the component mounting machine of the first embodiment. The function of operation section 27 of this embodiment may be used in component mounting machine 10a of the second embodiment.

Fourth Embodiment

Figure 5:
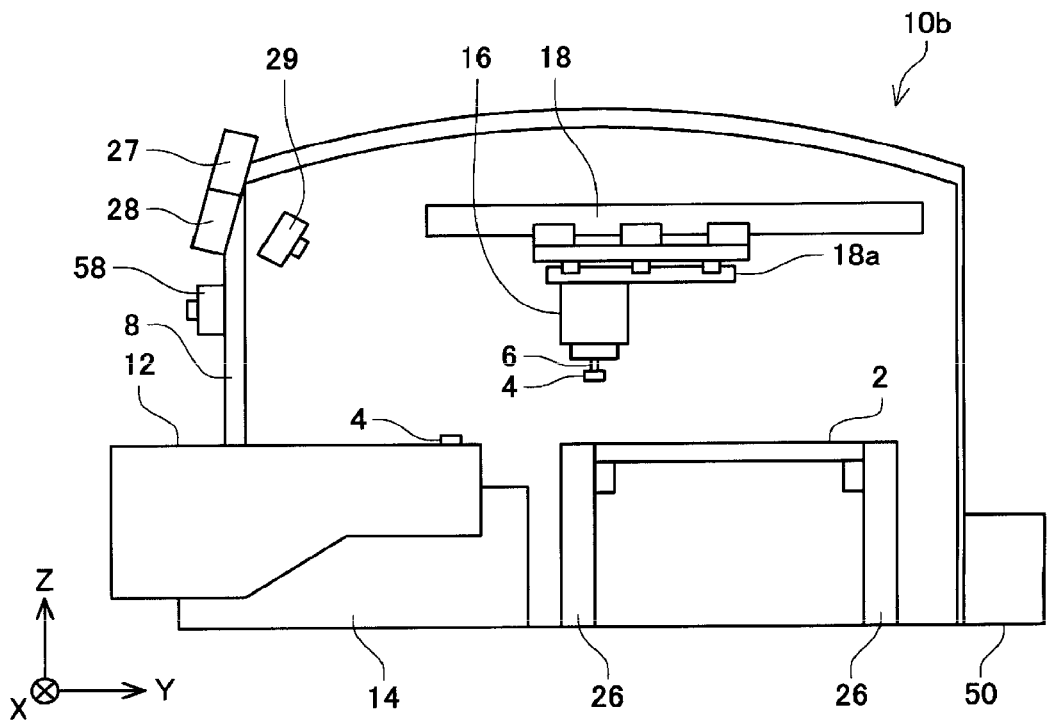
FIG. 5 is a side view schematically illustrating the configuration of a component mounting machine of a fourth embodiment.

Next, a description will be given of a component mounting machine 10b of a fourth embodiment with reference to FIG. 5. As illustrated in FIG. 5, component mounting machine 10b is further provided with external camera 58. External camera 58 is attached to an external portion of component mounting machine 10b at a position (the front face of housing 8) at which it is possible to image a user working area of component mounting machine 10b. The imaging by external camera 58 is performed every predetermined period (every extremely short period of time). External camera 58 is connected to control device 50 to be capable of communication.

Figure 6:
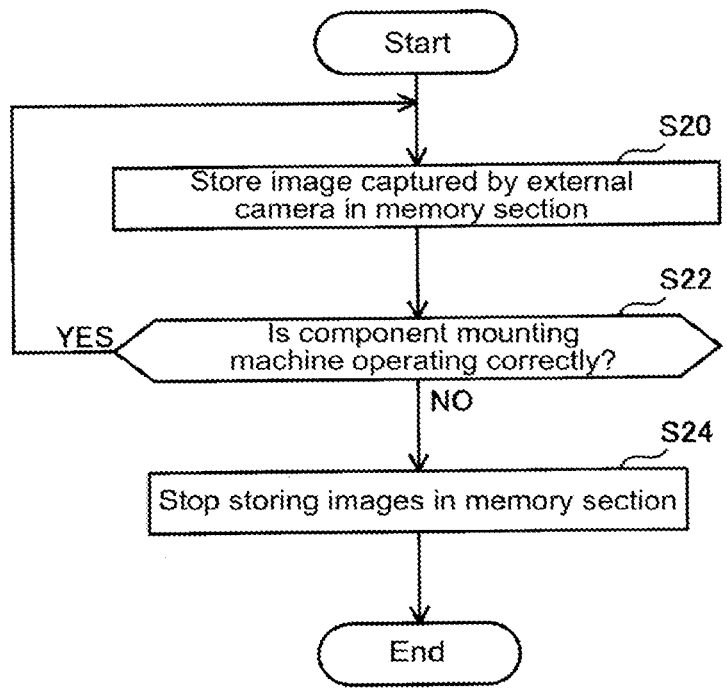
FIG. 6 is a diagram illustrating a flowchart of a process of storing a captured image of an external camera in a memory section in the component mounting machine of the fourth embodiment.

Memory section 54 stores the captured images of external camera 58. Here, a description will be given of the storage process of memory section 54 using FIG. 6. First, memory section 54 stores, in order, the captured images of external camera which are captured every predetermined period (S20). Although the captured images of external camera 58 are accumulated in memory section 54, memory section 54 continues the storage of the captured images by overwriting in order from the old captured images with the new captured images. Next, while determination section 52 determines that component mounting machine 10b is operating correctly (YES in S22), memory section 54 continues to store the captured images of external camera 58 (return to S20). Meanwhile, in a case in which determination section 52 determines that an abnormality has occurred in component mounting machine 10b (NO in S22), memory section 54 stops storing the captured images of the external camera 58 thereafter (S24). Accordingly, as described in the first embodiment, it is possible to prevent the captured images of the time at which the abnormality occurred in component mounting machine 10b from being overwritten by the captured images after the abnormality occurred in component mounting machine 10b.

Memory section 54 is configured to store the captured images of fixed camera 29 and the captured images of external camera 58 in separate memories. Therefore, the captured images of one are prevented from being overwritten by the captured images of the other.

In component mounting machine 10b of the present embodiment, it is possible to image the working area of the user using external camera 58. Therefore, it is possible to check the work being performed by the user when an abnormality occurs in component mounting machine 10b and it is possible to ascertain the origin of the abnormality which occurs due to human error. In the present embodiment too, since the configuration of fixed camera 29 is the same as that of the first embodiment, it is possible to obtain the same operations and effects as component mounting machine 10 of the first embodiment. The configuration of external camera 58 of the present embodiment may also be used in the component mounting machines of the second and third embodiments.

Although a detailed description is given of the technological embodiments which are disclosed in the present description, these are merely exemplary and do not limit the claims. The technology described in the claims includes various modifications and changes to the specific examples which are exemplified above.

For example, although operation section 27 and display section 28 are configured separately in the embodiments which are described above, operation section 27 and display section 28 may be configured integrally.

The configuration of external camera 58 in the fourth embodiment is not limited to a case in which external camera 58 is provided on the component mounting machine, and external camera 58 may be installed on other work machines (for example, a machine tool, a printer, a coating machine, an inspector, or the like).

The technical elements described in the present description or the drawings exhibit technical usefulness on their own or in various combinations and are not limited to the combinations described in the claims at the time of application. The technology exemplified in the present description or the drawings may achieve multiple objects at the same time and the achievement of one of these objects in itself has technical usefulness.

REFERENCE SIGNS LIST

2: circuit substrate, 4: electronic component, 6: suction nozzle, 8: housing, 10: component mounting machine, 12: component feeder, 14: feeder holding section, 16: transfer head, 18: moving device, 18a: movement base, 26: conveyance lane, 27: operation section, 28: display section, 29: fixed camera, 50: control device, 52: determination section, 54: memory section, 56: detection section, 58: external camera

The invention claimed is:

1. A component mounting machine which mounts an electronic component onto a circuit substrate, comprising:
a conveyance lane which conveys the circuit substrate;
a component feeder which is disposed at a position distanced from the conveyance lane and which houses the electronic component;
a suction nozzle which picks up the electronic component by suctioning an upper face of the electronic component;
a transfer head which supports the suction nozzle and moves the suction nozzle relative to the component feeder and the circuit substrate conveyed in the conveyance lane such that the suction nozzle picks up the electronic component supplied from the component feeder and mounts the electronic component picked up by the suction nozzle onto the circuit substrate conveyed by the conveyance lane;
a fixed camera which monitors an inner portion of the component mounting machine;
a display section configured to display a captured image of the fixed camera; and
processing circuitry configured to control operations of the transfer head,
wherein the fixed camera is configured to image a range from a pickup position at which the suction nozzle picks up the electronic component from the component feeder to a mounting position at which the electronic component is mounted onto the circuit substrate within a single image, the pickup position disposed between the fixed camera and the mounting position.

2. The component mounting machine according to claim 1,
wherein the fixed camera is disposed in the inner portion of the component mounting machine on a side more distanced from the mounting position than the pickup position in a first direction joining the pickup position and the mounting position.

3. The component mounting machine according to claim 1,
wherein the processing circuitry includes a determination section which determines whether the component mounting machine is operating correctly and a memory section which stores the captured images of the fixed camera,
wherein the fixed camera captures an image every predetermined period, and
wherein the memory section continues storing the captured images which are captured every predetermined period by the fixed camera while the determination section determines that the component mounting machine is operating correctly, whereas, in a case in which the determination section determines that an abnormality occurs in the component mounting machine, the memory section stops storing the captured images which are captured by the fixed camera thereafter.

4. The component mounting machine according to claim 3, further comprising:
an external camera which is attached to the component mounting machine and images a user working area, which is outside of the component mounting machine, every predetermined period,
wherein the memory section continues storing the images which are captured every predetermined period by the external camera while the determination section determines that the component mounting machine is operating correctly, whereas, in a case in which the determination section determines that the abnormality occurs in the component mounting machine, the memory section stops storing the images which are captured by the external camera thereafter.

5. The component mounting machine according to claim 1, further comprising:
a detection section which detects that the component feeder is inserted into the component mounting machine,
wherein the processing circuitry causes the display section to display the captured image in a case in which the detection section detects that the component feeder is inserted into the component mounting machine.

6. The component mounting machine according to claim 1, further comprising:

an operation section which is electrically connected to the processing circuitry,
wherein the processing circuitry causes the display section to display the captured image which is captured by the fixed camera based on operation of the operation section by a user.

\* \* \* \* \*